(12) United States Patent
Wang et al.

(10) Patent No.: US 12,733,277 B2
(45) Date of Patent: Sep. 8, 2026

(54) LIGHT SHIELD FOR PIXEL OF IMAGE SENSOR

(71) Applicant: Taiwan Semiconductor Manufacturing Company, Hsinchu (TW)

(72) Inventors: Wen-Sheng Wang, Hsinchu (TW); Yi-Hsuan Fan, New Taipei (TW); Yen-Ting Chen, Changhua (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 613 days.

(21) Appl. No.: 18/123,062

(22) Filed: Mar. 17, 2023

(65) Prior Publication Data

US 2024/0313017 A1 Sep. 19, 2024

(51) Int. Cl.
*H10F 39/00* (2025.01)

(52) U.S. Cl.
CPC ....... *H10F 39/8057* (2025.01); *H10F 39/024* (2025.01); *H10F 39/802* (2025.01)

(58) Field of Classification Search
CPC ........................... H10F 39/8057; H10F 39/024
See application file for complete search history.

(56) References Cited

U.S. PATENT DOCUMENTS 7,791,659 B2 * 9/2010 Yokozawa ............ H10F 39/024 348/274
8,736,727 B2 * 5/2014 Ando .................... H10F 39/024 348/340

(Continued)

FOREIGN PATENT DOCUMENTS

CN 101369596 A 2/2009
CN 102214667 A 10/2011

(Continued)

OTHER PUBLICATIONS

Taiwan Office Action of Application No. 11320029910 Date: Jan. 8, 2024.

*Primary Examiner* — Mounir S Amer
*Assistant Examiner* — Alexander Belousov
(74) *Attorney, Agent, or Firm* — Lippes Mathias LLP

(57) ABSTRACT

A pixel of an image sensor includes: a semiconductor material substrate; a photosensitive region formed in the substrate, the photosensitive region generating photo-induced electrical charge in response to illumination with light; a storage node formed in the substrate proximate to the photosensitive region, the storage node selectively receiving and storing photo-induced electrical charge generated by the photosensitive region; a transfer gate structure formed between the photosensitive region and the storage node to regulate a transfer of the photo-induced electrical charge therebetween; an inter-layer dielectric (ILD) formed over the transfer gate structure; and a light-shielding structure contained within the ILD and covering the transfer gate structure so as to inhibit light from reaching the transfer gate structure, the light-shielding structure including an indentation on a first end surface of the light-shielding structure, which first end surface is proximate to the transfer gate structure, wherein an end of the transfer gate structure at least partially extends into the indentation such that the end of the transfer gate structure extending into the indentation is at least partially surrounded by the light-shield structure.

20 Claims, 7 Drawing Sheets

(56) References Cited

U.S. PATENT DOCUMENTS 10,163,959 B2 * 12/2018 Yamashita .............. H10F 39/18
10,700,117 B2 * 6/2020 Yamashita .......... H10F 39/8057
10,833,115 B2 * 11/2020 Huang .............. H10F 39/80373
10,991,747 B2 * 4/2021 Yamashita ............ H10F 39/812
11,075,238 B2 * 7/2021 Cheng ................... H10F 39/014
11,728,362 B2 * 8/2023 Li ....................... H10F 39/8057
348/296
11,776,983 B2 * 10/2023 Yamashita .............. H10F 39/18
257/292
11,791,354 B2 * 10/2023 Tseng .................... H10F 39/014
257/292
12,094,901 B2 * 9/2024 Tseng ................... H04N 25/711
12,294,012 B2 * 5/2025 Yamashita .......... H10F 39/8057
12,363,459 B2 * 7/2025 Lee ..................... H10F 39/8057
2006/0187381 A1 * 8/2006 Yokozawa .......... H10F 39/8063
257/E27.159
2011/0242376 A1 * 10/2011 Ando .................. H10F 39/8067
257/E31.127
2016/0035774 A1 2/2016 Noh et al.
2017/0141145 A1 * 5/2017 Yamashita ............ H10F 39/805
2019/0109164 A1 * 4/2019 Yamashita ............ H10F 39/805
2019/0355771 A1 * 11/2019 Cheng ................... H10F 39/014
2020/0266228 A1 * 8/2020 Huang .................. H10F 39/199
2020/0303433 A1 * 9/2020 Yamashita .............. H10F 39/18
2021/0225908 A1 * 7/2021 Yamashita ............ H10F 39/199
2021/0351215 A1 * 11/2021 Tseng ................. H04N 25/7795
2022/0384506 A1 * 12/2022 Tseng ................. H04N 25/7795
2023/0335569 A1 * 10/2023 Li .......................... H04N 25/79
2023/0362515 A1 * 11/2023 Lee ....................... H10F 39/803
2023/0369374 A1 * 11/2023 Yamashita ............ H10F 39/014
2024/0313017 A1 * 9/2024 Wang .................... H10F 39/024
2024/0363658 A1 * 10/2024 Tseng .................. H10F 39/8063
2024/0387594 A1 * 11/2024 Yamashita .......... H10F 39/8057

FOREIGN PATENT DOCUMENTS

CN 111463225 A 7/2020
CN 111463225 B * 6/2023 ........... H10F 39/014
TW 202143459 A 11/2021

* cited by examiner

LIGHT SHIELD FOR PIXEL OF IMAGE SENSOR

BACKGROUND

The following relates to the semiconductor arts, and in particular, to an semiconductor image sensor, for example, such as a global shutter (GS) complementary metal-oxide semiconductor (CMOS) image sensor (CIS), and manufacturing processes and/or methods therefor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features as shown in the accompany figures may be arbitrarily increased or reduced for clarity of discussion.

DETAILED DESCRIPTION

Figure 1:
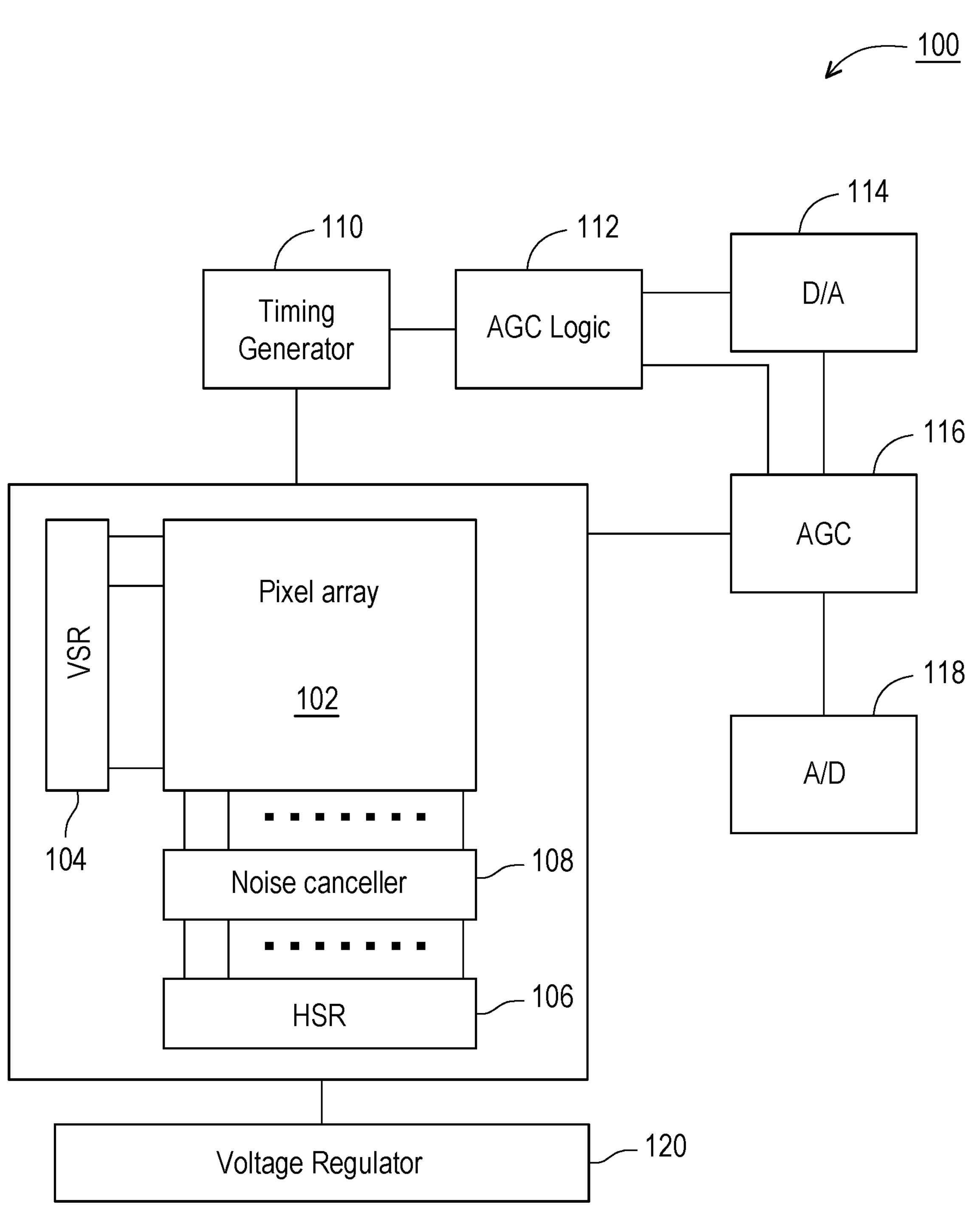
FIG. 1 illustrates a block diagram of a CIS in accordance with some embodiments disclosed herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Further, it is to be understood that when an element is referred to as being "connected to" or "coupled to" another element, it may be directly connected to or coupled to the other element, or one or more intervening elements may be present. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "left," "right," "side," "back," "rear," "behind," "front," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "about" may include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

In accordance with some suitable embodiments disclosed herein, a CIS or other like or suitable image sensor is provided with one or more active pixels, each active pixel including one or more light-shielding structures, for example, made of an appropriate metal or other suitable material. Suitably, for a given active pixel, the light-shielding structures overlay a transistor gate structure (nominally referred to herein also as a transfer gate structure) which operates to regulate a transfer of photogenerated charge carriers from a photodiode of the active pixel to a local memory node or storage node (SN) of the active pixel. Advantageously, the light-shielding structures disclosed herein improve shutter efficiency and/or device performance by protecting the aforementioned transfer gate structure from being struck and/or otherwise impacted by stray or unwanted light, which could otherwise degrade device performance and/or lead to undesirable image artifacts if the transfer gate structure were exposed to the unwanted stray light.

In some suitable embodiments, a first light-shielding structure is contained within an interlayer dielectric (ILD) layer. The ILD layer may overlay a silicon or other semiconductor substrate, for example, in which the photodiode and SN of an active pixel are formed. In some suitable embodiments, a second light-shielding structure may overlay the ILD layer. In practice, the transfer gate structure is located under or beneath and/or is otherwise covered by the first and second light-shielding structures. Suitably, the transfer gate structure is located between the photodiode and the SN, overlaying the substrate and extending into the ILD layer.

In practice, as mentioned above, the light-shielding structures shield and/or protect the transfer gate structure from unwanted stray or otherwise incident light, thereby advantageously guarding against light leakage into or onto this region and/or element so as to guard against unwanted artifacts or the like which could otherwise be produced by parasitic or other light leakage into or onto the transfer gate structure. Suitably, on a side of the first light-shielding structure facing the transfer gate, the first light-shielding structure includes an indentation into which an end of the transfer gate extends. Accordingly, the end of the transfer gate extending into the indentation may be surrounded by a one or more walls of the first light-shielding structure which extend below an uppermost surface of the transfer gate. In this way, by encircling the uppermost end of the transfer gate structure within the indentation of the first light-shielding structure, the first light-shielding structure advantageously provides improved shielding of the transfer gate structure, for example, as compared to the second light-shielding structure alone.

In some suitable embodiments, the image sensor may be a front side illuminated (FSI) image sensor. In some suitable embodiments, the image sensor may be a global shutter (GS) CIS. A GS CIS may be advantageously used in various applications, for example, because of its numerous benefits, including, without limitation, simultaneous pixel exposure and readout allowing for much higher quality imaging especially at high speeds, high frame rates, and high resolution. One suitable implementation of a GS CIS uses a memory-in-pixel approach, in which each pixel of the GS CIS, in addition to a photodiode and readout circuitry, contains an extra memory node or SN to temporarily store photo-generated charges generated by the photodiode. Using this approach, all the pixels in the CIS start an exposure at or near the same time. At the end of the exposure, photo-generated charges are globally transferred from photodiodes to corresponding local memory nodes or SNs and readout therefrom, for example, through an otherwise traditional row-by-row scanning. Suitably, the pixel-level SN receives photo-generated charges from a corresponding photodiode and allows them to accumulate, for example, eliminating a need for rolling shutter pulses. However, parasitic light or light leakage to the SN, for example, due to mechanisms like diffraction and scattering, can also generate photo-generated charges which then contaminate the stored charges in the SN, thereby potentially causing unwanted artifacts. In some suitable embodiments disclosed herein, contamination which could otherwise be caused by the parasitic light to the photo-generated charges from the photodiode and stored in the SN may be minimized before being readout, for example, in order to achieve a relatively high image quality. Advantageously, the light-shielding structures, and in particular the first light-shielding structure as described herein, can increase and/or improve a global shutter efficiency of the image sensor, for example, as compared to some other similar image sensors without such light-shielding structures.

With reference now to FIG. 1, there is illustrated a block diagram of an CIS 100 in accordance with some embodiments of the present disclosure. It is to be appreciated that the illustrated CIS 100 is merely an example image sensor and is not intended to limit the present disclosure. Accordingly, it is understood that additional functional blocks may be provided in or coupled to the CIS 100 of FIG. 1, and that some other functional blocks may only be briefly described herein.

In the illustrated embodiment of FIG. 1, the CIS 100 includes a pixel array 102, a vertical shift register (VSR) 104, a horizontal shift register (HSR) 106, a noise canceller 108, a timing generator 110, an automatic gain control (AGC) logic 112, a digital-to-analog (D/A) convertor 114, an AGC 116, an analog-to-digital (A/D) convertor 118, and a voltage regulator 120. The pixel array 102 includes a plurality of active pixels that are arranged in a matrix of corresponding columns and rows, for example, as discussed in further detail below with reference to FIGS. 2A and/or 2B. In some suitable embodiments, the CIS 100 is a GS CIS. In some suitable embodiments, each of the plurality of active pixels of the pixel array 102 may comprise a CMOS or other suitable photodiode, a memory node or SN, and a plurality of transistors. In some suitable embodiments, the pixel array 102 may further comprises a plurality of dummy pixels suitably arranged at or near a boundary of the active pixels, which dummy pixels in effect serve as an optical dummy, for example, in order to help safeguard that the active pixels at the boundary have the same or nearly the same performance as the rest of the active pixels.

In some suitable embodiments, the SN in each of the plurality of active pixels comprises a floating diffusion capacitor. In some other embodiments, the SN further comprises a diode. In some suitable embodiments, the plurality of transistors in each of the plurality of active pixels are used for at least one of the following: transferring photo-generated charges to the SN of a corresponding CMOS or other suitable photodiode, resetting the photodiode for receiving a new exposure, resetting the SN of the corresponding CMOS or other suitable photodiode for receiving photo-generated charges from the new exposure, and enabling an active pixel for signal output.

In some suitable embodiments, the vertical shift register (VSR) 104 is configured to perform at least one of the following functions, including receiving a row address of the pixel array 102 from the timing generator 110, and driving controlling lines of the pixel array 102. In some suitable embodiments, the horizontal shift register (HSR) 106 is configured to perform reading out output signals column by column. For example, the VSR 104 and the HSR 106 each is suitably coupled to the pixel array 102. In the illustrated embodiment, the HSR 106 is coupled to the pixel array 102 through the noise canceler 108, wherein the noise canceller 108 is a circuit or the like that removes noise from output signals.

In some suitable embodiments, the timing generator 110 generates a clock signal or the like to synchronize the output signals from the pixel array 102. The auto gain control (AGC) 116 may be a system, circuit or the like to tune an amplitude of the output signals. In the illustrated embodiment, the AGC 116 is coupled to the AGC logic 112 which may provide control to the AGC 116. In some suitable embodiments, the AGC 116 is further coupled to the D/A convertor 114, which converts digital signals to analog signals. Suitably, the AGC 116 may further be coupled to the pixel array 102, the VSR 104, the HSR 106 and the noise canceller 108. In the illustrated embodiment, the AGC 116 is coupled to the A/D convertor 118, which converts analog signals to digital signals. In some suitable embodiments, the voltage regulator 120 is coupled to the pixel array 102, the VSR 104, the HSR 106 and the noise canceller 108, for example, to provide voltage control and/or maintain a constant voltage level to the coupled components or elements.

Figure 2A:
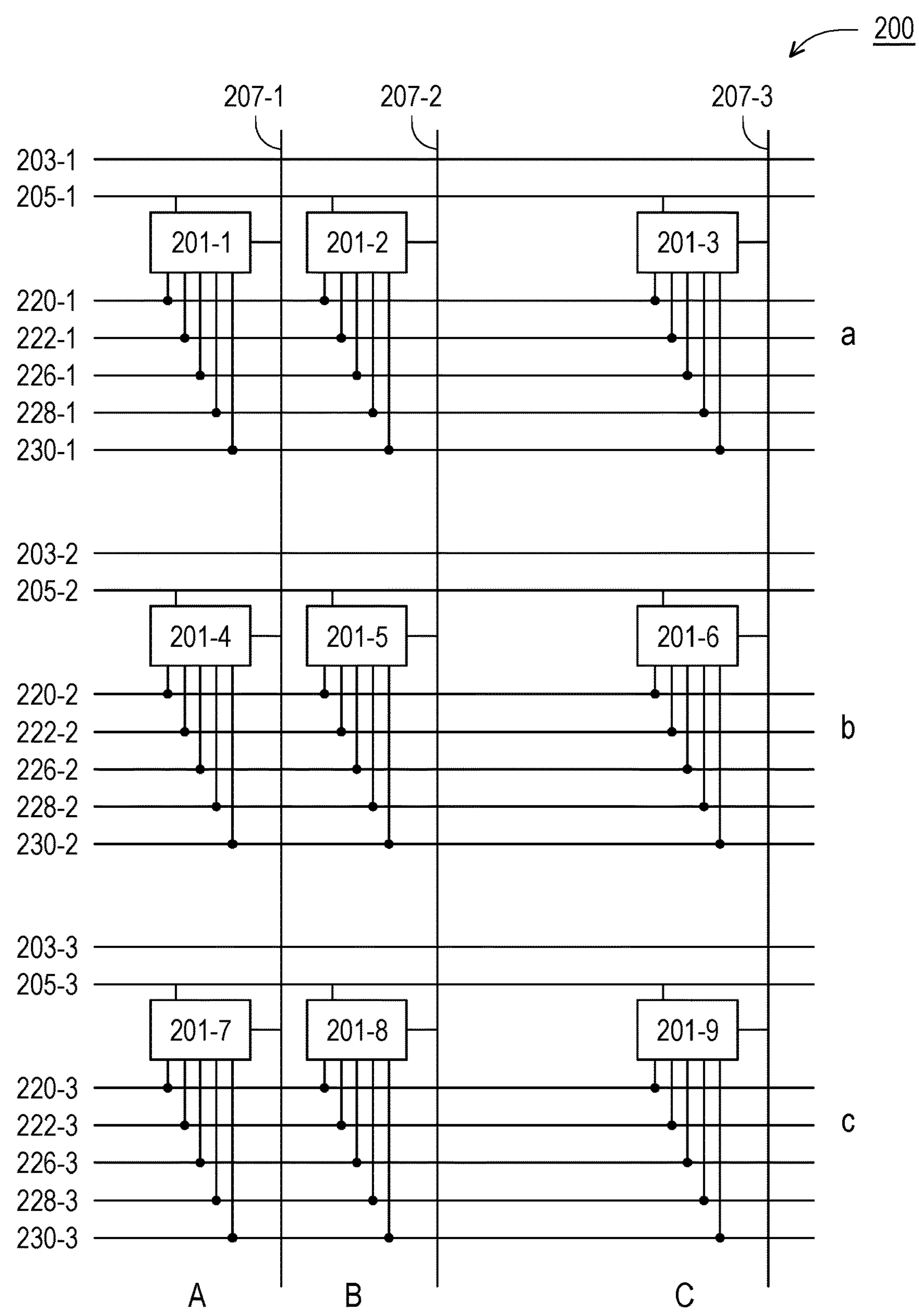
FIG. 2A illustrates a circuit diagram of a pixel array in accordance with some embodiments disclosed herein.

With reference now to FIG. 2A, there is illustrated a suitable circuit diagram of a pixel array 200, in accordance with some embodiments of present disclosure. For example, the pixel array 200 illustrated in FIG. 2A may correspond to the pixel array 102 of the CIS 100 shown in FIG. 1. In the illustrated embodiment of FIG. 2A, the pixel array 200 of the CIS 100 includes a plurality of active pixels or cells 201-1, 201-2, 201-3, 201-4, 201-5, 201-6, 201-7, 201-8, and 201-9. For simplicity herein, only 9 active pixels or cells are shown in FIG. 2A. However, in practice, any desired number of active pixels may be included in the pixel array 200 while remaining within the scope of the present disclosure. As described above, the active pixels or cells 201-1, 201-2, 201-3, 201-4, 201-5, 201-6, 201-7, 201-8, and 201-9, are arranged in a matrix of columns (designated by reference characters A, B and C) and rows (designated by reference characters a, b and c). More specifically, in some embodiments, the pixel array 200 includes voltage control lines, for example, from the vertical shift register (VSR) 104, and readout lines 207-1, 207-2, and 207-3. In some embodiments, the pixel array 200 also includes a positive supply voltage power (VDD) 203-1, 203-2, and 203-3, and a zero voltage reference (GND) 205-1, 205-2, and 205-3. As such, the pixel array 200 may include a first plurality of columns (for example, arranged vertically), and a second plurality of rows (for example, arranged horizontally), wherein each column includes a respective pair of VDD 203 and GND 205, and corresponding readout line 207, and each row includes a respective VDD 203, GND 205, and voltage control lines, i.e., G_RST 220, TX 222, RST 226, OP 228 and R_SEL 230. In the illustrated embodiments, the 9 cells or pixels 201 in the pixel array 200 each may also provide corresponding data outputs directly through corresponding readout line 207.

For example, as shown in the illustrated embodiment of FIG. 2A, the pixel array 200 includes columns "A," "B," and "C," and rows "a," "b," and "c," wherein column A includes respective readout line 207-1; column B includes respective readout line 207-2; column C includes respective readout line 207-3; row a includes a respective VDD 203-1, GND 205-1, and voltage control lines 220-1, 222-1, 226-1, 228-1 and 230-1; row b includes a respective VDD 203-2, GND 205-2, and voltage control lines 220-2, 222-2, 226-2, 228-2 and 230-2; and row c includes a respective VDD 203-3, GND 205-3, and voltage control lines 220-3, 222-3, 226-3, 228-3 and 230-3. For simplicity herein, only 3 columns and 3 rows are shown in FIG. 2A. However, in practice, any desired number of columns and/or rows of active pixels may be included in the pixel array 200 while remaining within the scope of the present disclosure.

In the illustrated embodiment, each row comprises 5 control lines, G_RST 220, RST 226, OP 228, TX 222, and R_SEL 230. In some suitable embodiments, as discussed in detail below, the 5 control lines are to provide control signals to the gates of five transistors in each of the pixels of the corresponding row. Specifically, row a includes a respective G_RST 220-1, RST 226-1, OP 228-1, TX 222-1, and R_SEL 230-1; row b includes a respective G_RST 220-2, RST 226-2, OP 228-2, TX 222-2, and R_SEL 230-2; and row c includes a respective G_RST 220-3, RST 226-3, OP 228-3, TX 222-3, and R_SEL 230-3.

As described above, each active cell or pixel of the pixel array 200 (for example, 201-1, 200-2, 201-3, 201-4, 200-5, 201-6, 200-7, 201-8, 201-9, etc.) may include a plurality of transistors, which is discussed in greater detail below with reference to FIG. 2B. It should be also noted that FIG. 2A is only an example for illustration purposes and is not intended to be limiting. The type of signal lines in a pixel array 200 in this present disclosure can be arranged in different ways depending on the circuit layout design and types of bit cells used in the array.

Figure 2B:
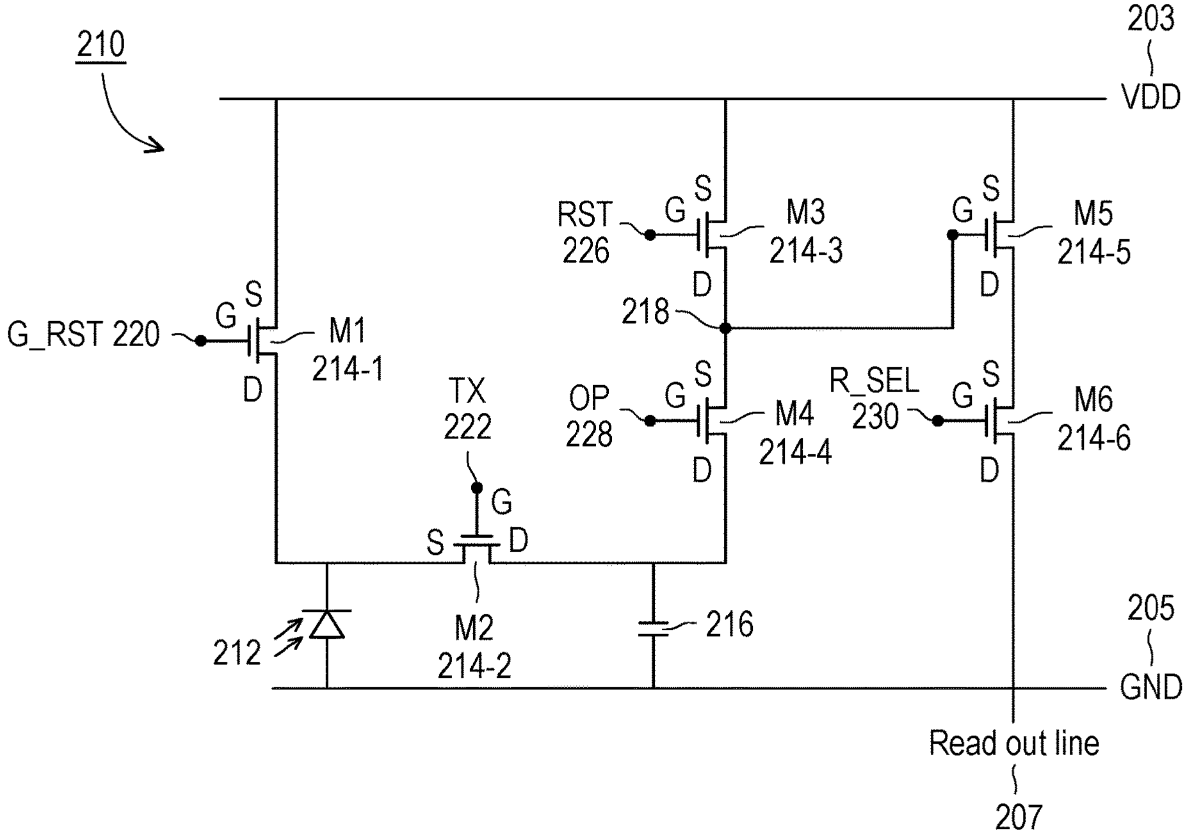
FIG. 2B illustrates a circuit diagram of a pixel in accordance with some embodiments disclosed herein.

With reference now to FIG. 2B, there is illustrated a circuit diagram of an active pixel 210, for example, in the pixel array 200, in accordance with some embodiments of the present disclosure. For example, the active pixel 210 shown in FIG. 2B may correspond to any one or more of the active pixels or cells 201-1, 201-2, 201-3, 201-4, 201-5, 201-6, 201-7, 201-8 or 201-9 shown in FIG. 2A.

In the illustrated embodiment of FIG. 2B, the active pixel 210 comprises a photodiode 212, and 6 transistors M1-M6, namely, transistor M1 214-1, transistor M2 214-2, transistor M3 214-3, transistor M4 214-4, transistor M5 214-5, and transistor M6 214-6. In some embodiments, each of the 6 transistors in the active pixel 210 comprises a p-type metal-oxide-semiconductor (PMOS) transistor. Although the illustrated embodiment of FIG. 2B shows that transistors M1-M6 are PMOS transistors, any of a variety of transistors or other like devices that are suitable for use in a memory or other like device may be implemented as at least one of the transistors M1-M6 such as, for example, an n-type metal-oxide-semiconductor (NMOS) transistor, a bipolar junction transistor (BJT), a high-electron mobility transistor (HEMT), etc.

In some suitable embodiments, the active pixel 210 may further include a capacitor 216, for example, which effectively serves as the local SN of the active pixel 210. In some embodiments, the transistors M1 214-1 and M3 214-3 are reset transistors. In some embodiments, the transistor M1 214-1 is a global reset gate and the transistor M3 214-3 is a reset gate.

In some suitable embodiments, the source terminals of the transistors M1 214-1, M3 214-3 and M5 214-5 are coupled to VDD 203. The drain terminal of the transistor M1 214-1 is further coupled to the photodiode 212, wherein one of the terminals of the photodiode 212 is coupled to GND 205. The drain terminal of the transistor M1 214-1 is further coupled to the source terminal of the transistor M2 214-2. The drain terminals of the transistors M2 214-2 and M4 214-4 are coupled together to GND through the capacitor 216. The drain terminal of the transistor M3 214-3 and the source terminal of the transistor M4 214-4 are coupled together at node 218. The drain terminal of the transistor M5 214-5 and source terminal of the transistor M6 214-6 are coupled together. In some suitable embodiments, gate terminal of the transistor M5 214-5 is coupled to the node 218. The drain terminal of the transistor M6 214-6 is coupled to the readout line 207. The gate terminals of the transistors M1 214-1, M2 214-2, M3 214-3, M4 214-4 and M6 214-6 are coupled to a first control line (G_RST) 220, a second control line (TX) 222, a third control line (RST) 226, a fourth control line (OP) 228, and a fifth control line (R_SEL) 230, respectively.

In some suitable embodiments, when sensing for example, a voltage on the G_RST control line 220 switching from low to high turns on the transistor M1 214-1 so as to reset the photodiode 212. The photodiode 212 then receives light signals and photon-induced charge carriers are generated within the photodiode 212. The voltage on the TX control line 222 is then switched from low to high so as to turn on the transistor M2 214-2, while the voltage on the OP control line 228 is kept low so as to turn off the transistor M4 214-4. The photon-inducted charge carriers are then directed to the capacitor 216 (for example, which effectively acts as the SN of the active pixel 210) through the transistor M2 214-2. In some suitable embodiments, as discussed in greater detail below, the gate of the transistor M2 214-2 (i.e., the transfer gate structure which acts and/or functions as the gate of the transistor M2 214-2) is suitably covered and/or otherwise protected by one or more light-shielding structures to inhibit and/or guard against light induced noise.

In some suitable embodiments, when reading a background signal for example, the voltage on the OP control line 228 is kept low to keep the transistor M4 214-4 off and the voltage on the RST control line 226 is switched from low to high so as to turn on the transistor M3 214-3, which pulls up the voltage level at the node 218 from low to high. The voltage on the node 218 is then able to turn on the transistor M5 214-5. The voltage on the R_SEL control line 230 is then switched from low to high so as to read a background signal to the readout line 207.

In some suitable embodiments, when reading the stored photo-inducted charge carriers out to the readout line 207 for example, the voltage on the RST control line 226 is then switched from high to low; the voltage on the OP control line 228 is switched from low to high; and the voltage on the R_SEL control line 230 is kept high so as to read out the signal stored on the SN to the readout line 207.

The layout, arrangement and/or structure of selected portions, elements and/or components of an active pixel, for example, such as the active pixel 210 shown in FIG. 2B, are shown in FIGS. 3-6. For ease of reference and illustrative purposes herein, in FIGS. 3-6, the various elements and/or components depicted therein are shown relative to an otherwise arbitrarily chosen three-dimensional (3D) cartesian coordinate system including X, Y and Z axes as shown in the FIGURES. While consistency is maintained among and/or across the various FIGURES (unless otherwise explicitly noted), it is to be appreciated the directions and/or orientations indicated by these axes are chosen primarily for the purpose of facilitating the description provided herein, for example, to describe and/or identify relative orientations and/or directions. Unless otherwise indicated, the illustrated coordinate system and/or axes, in and of themselves, are not intended to be limiting and should not be read or interpreted as such.

Figure 3:
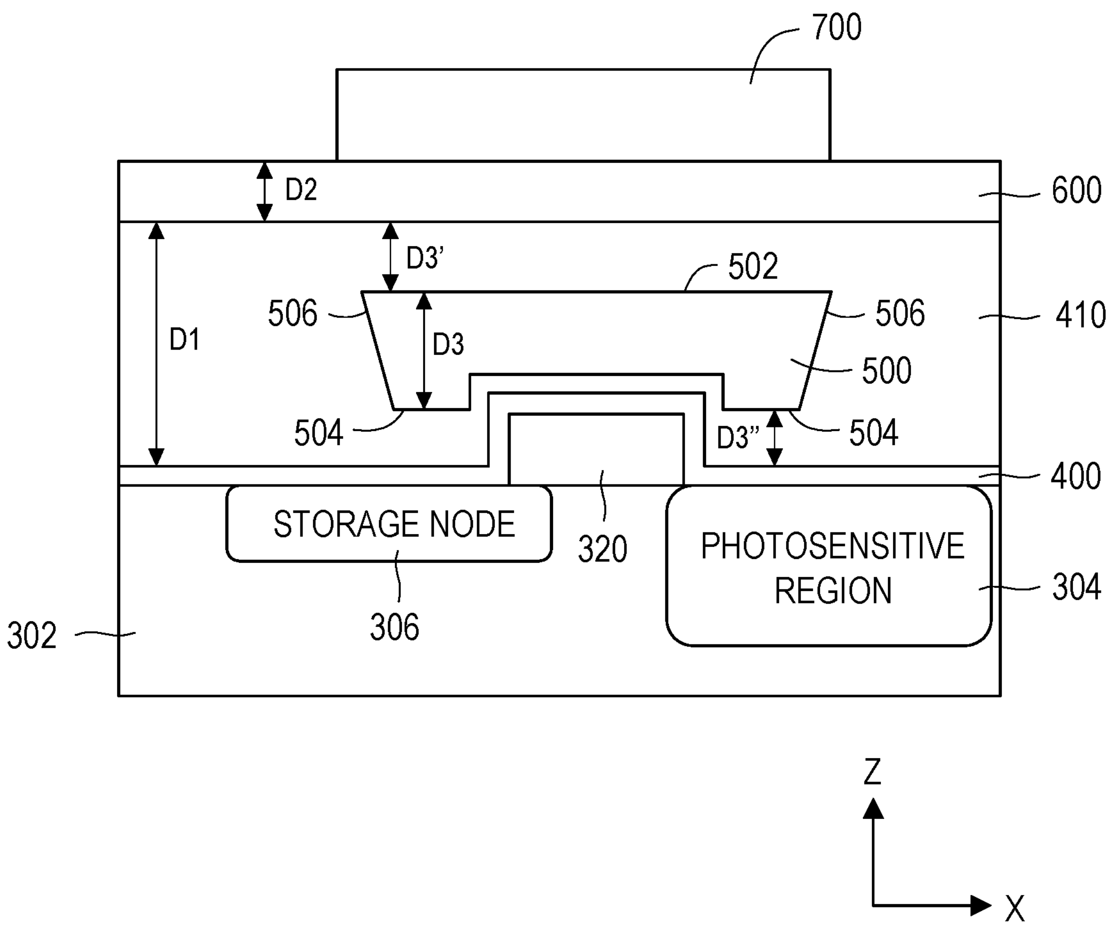
FIG. 3 is a diagrammatic illustration showing a partial cross-section view of a pixel in accordance with some embodiments disclosed herein.

In particular, FIG. 3 is a partial cross-section view showing the layout, structure and/or arrangement of selected elements and/or components comprising the active pixel 210 in accordance with some suitable embodiments described herein. As shown in FIG. 3, the active pixel 210 includes a pixel region (for example, comprising the photodiode 212 shown in FIG. 2B), a storage region (for example, also referred to as the SN and comprising the capacitor 216 shown in FIG. 2B) and a transfer gate structure formed between the pixel region (i.e., the photodiode 212) and the storage region or SN (i.e., capacitor 216). As described below and/or shown in later FIGURES, in some suitable embodiments one or more light-shielding structures cover and/or protect the transfer gate structure, for example, to inhibit unwanted stray light from entering and/or impinging thereon.

Referring to FIG. 3, a substrate 302 is provided, in which the photosensitive pixel region 304 and storage region or SN 306 are formed. In some suitable embodiments, the substrate 302 may be made of silicon or other semiconductor materials. In some embodiments, the substrate 302 is a wafer. Alternatively or additionally, the substrate 302 may include other elementary semiconductor materials such as germanium. In some embodiments, the substrate 302 is made of a compound semiconductor or alloy semiconductor, such as silicon carbide, gallium arsenic, indium arsenide, or indium phosphide, silicon germanium, silicon germanium carbide, gallium arsenic phosphide, or gallium indium phosphide. In some embodiments, the substrate 302 includes an epitaxial layer. For example, the substrate 302 may have an epitaxial layer overlying a bulk semiconductor.

As previously mentioned, the active pixel 210 may include a pixel region 304 and a storage region 306 formed in the substrate 302. In practice, the storage region 306 may comprise and/or be referred to as the SN, for example, including the capacitor 216 shown in FIG. 2B, or another like or suitable charge storage element. The pixel region 304 (also referred to as the photosensitive region) suitably includes photosensitive elements, for example such as the photodiode 212 shown in FIG. 2B. More generally, the photosensitive elements may include a photodiode, a partially pinned photodiode, a pinned photodiode, or a photocapacitor. In some suitable embodiments, the pixel region 304 may be a doped region doped with n-type and/or p-type dopants. In some suitable embodiments, the pixel region 304 may be formed by an ion implantation process, a diffusion process or another applicable process. In some suitable embodiments, the storage region 306 is formed, arranged and/or located adjacent to the pixel region 304. In practice, the storage region or SN 306 comprises, for example, the capacitor 216 shown in FIG. 2B or another like or suitable storage element, and is configured to temporarily store a charge. In some suitable embodiments, the storage region or SN 306 may be a doped region doped with n-type and/or p-type dopants. In some suitable embodiments, the storage region or SN 306 may be formed by an ion implantation process, a diffusion process or another applicable process.

In some suitable embodiments, the transfer gate structure 320 is formed on and/or over the substrate 302 between the photosensitive or pixel region 304 and the storage region or SN 306. Suitably, the transfer gate structure 320 may comprise a polysilicon material. In some suitable embodiments, the transfer gate structure 320 may include a gate dielectric layer and a gate electrode layer formed thereover. A pair of gate spacer layers may be formed on sidewall surfaces of the transfer gate structure 320. The gate dielectric layer may be a single layer or multiple layers. In some suitable embodiments, the gate dielectric layer may be made of silicon oxide ($SiO_x$), silicon nitride ($Si_xN_y$), silicon oxynitride (SiON), dielectric material(s) with a high dielectric constant (high-k), or a combination thereof. In some embodiments, the gate dielectric layer may be formed by a deposition process, such as a chemical vapor deposition (CVD) process, a plasma enhanced chemical vapor deposition (PECVD) process, a spin coating process or another applicable process. For example, the gate electrode layer may be made of a suitable conductive material, such as aluminum (Al), copper (Cu), tungsten (W), titanium (Ti), tantalum (Ta), or another applicable material. In some suitable embodiments, the gate electrode layer may be formed by a deposition process, such as chemical vapor deposition (CVD), physical vapor deposition (PVD), atomic layer deposition (ALD), or another applicable process. Suitably, the gate spacer layers may be made of silicon oxide, silicon nitride, silicon oxynitride or another applicable material. In some embodiments, the gate spacers are formed by a chemical vapor deposition (CVD) process, a physical vapor deposition (PVD) process, or another applicable process. While FIG. 3 shows the transfer gate structure 320 for and/or associated with the storage region or SN 306, in practice, a similar such gate structure or another like or suitable gate structure may be employed as the gate or gate terminal of any one or more of the transistors M1 214-1, M2 214-2, M3 214-3, M4 214-4 and M6 214-6.

As shown in FIG. 3, a contact etch stop layer (CESL) 400 is formed on and/or over the transfer gate structure 320 and the substrate 302. In some suitable embodiments, the CESL 400 may be made from a suitable material, for example, including, but is not limited to, silicon nitride ($Si_xN_y$), silicon oxide ($SiO_x$), silicon oxynitride (SiON), silicon carbide (SiC), silicon carbon-nitride (SiCN), boron nitride (BN), silicon boron nitride (SiBN), silicon carbon boron nitride (SiCBN), or combinations thereof. In practice, the CESL 400 may be formed on and/or over the transfer gate structure 320 and substrate 302 using any suitable material deposition method, for example, including, but not limited to, CVD, PECVD, PVD, ALD or the like.

As shown in FIG. 3, an inter-layer dielectric (ILD) 410 is formed on and/or over the CESL 400. In some suitable embodiments, the ILD 410 may use a dielectric material the same or different from the CESL 400, including, but not limited to, $SiN_x$, $SiO_x$, SiON, SiC, SiBN, SiCBN, or combinations thereof. In some embodiments, the ILD 410 may be formed using HDP, although other methods such as Sub-Atmospheric Pressure Chemical Vapor Deposition (SACVD), Lower Pressure Chemical Vapor Deposition (LPCVD), ALD, Plasma enhanced ALD (PEALD), Plasma enhanced CVD (PECVD), Monolayer Deposition (MLD), Plasma Impulse CVD (PICVD), spin-on, or the like may also be used.

In some suitable embodiments, as shown in FIG. 3, a first light-shielding structure 500 is formed and/or otherwise provided within the ILD 410. Suitably, various semiconductor manufacturing techniques may be employed to form the first light-shielding structure 500 within the ILD 410. For example, various material removal, material deposition and/or other semiconductor manufacturing processes and/or steps may be carried out in sequence to form the first light-shielding structure 500 within the ILD 410, including, without limitation, one or more semiconductor fabrication and/or manufacturing processes such as, photolithography and/or suitable layer pattering; ion implantation; diffusion; material deposition and/or layer forming processes including physical vapor deposition (PVD), metal evaporation or sputtering, chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), spin on coating; material removal processes such as etching including wet etching, dry etching, and plasma etching; chemical mechanical polishing (CMP); and/or other suitable semiconductor fabrication and/or manufacturing processes. In some embodiments, the ILD 410 may be built up using a series of one or more material depositions. Suitably, one or more of the depositions of material forming the ILD 410 may be patterned, and selected material defined by such patterning etched away. In turn, materials forming the first light-shielding structure 500 may be deposited, for example, in spaces previously occupied by the etched away ILD material. Finally, a last deposition of ILD material may complete the ILD 410 such that the first light-shielding structure 500 is contained therein. In some suitable embodiments, the completed ILD 500 may have a thickness D1, for example, measured in a direction of the Z axis as shown in FIG. 3.

Figure 4:
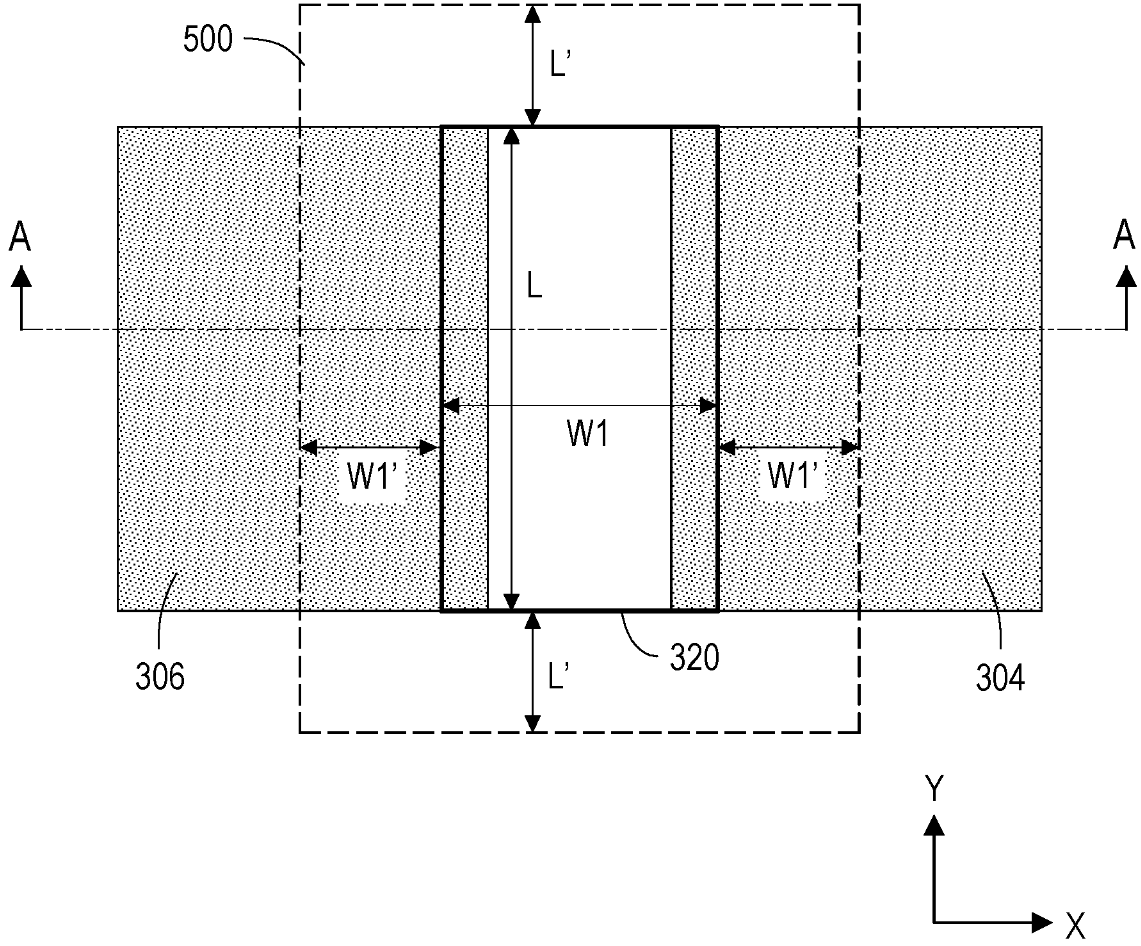
FIG. 4 is a diagrammatic illustration showing a partial top view of a pixel in accordance with some embodiments disclosed herein

With reference now to FIG. 4, there is shown a partial schematic top view of the of the active pixel 210 shown in FIG. 3, with a light-shielding structure 500 having been formed on and/or over the transfer gate structure 320. In FIG. 4, the relative layout of various components, element and/or structures are illustrated to show, for example, the vertical alignment and/or overlap of such components, element and/or structures. Accordingly, certain upper components, elements and/or structures (for example, the light-shielding structure 500 and the transfer gate structure 320) are shown in phantom and/or with broken lines to reveal underlying components and/or elements. FIG. 3 illustrates a cross-sectional view of the active pixel 210 taken along a section line A-A shown in FIG. 4, in accordance with various suitable embodiments disclosed herein.

As shown in FIG. 4, the transfer gate structure 320 resides in a horizontal direction (i.e., in a direction of the X axis) between the pixel or photosensitive region 304 and the local memory region or SN 306. In some suitable embodiments, the transfer gate structure 320 may at least partially overlap both the pixel or photosensitive region 304 and the local memory region or SN 306. Suitably, the transfer gate structure 320 may have a width W1 (taken in a direction of the X axis) and a length L (taken in a direction of the Y axis) as shown in FIG. 4. In some suitable embodiments, as shown in FIG. 4, the light-shielding structure 500 is wider than the width W of the transfer gate structure 320 by an amount W1' on either side of the transfer gate structure 320, where W' is in a range of between about one quarter of W1 (0.25×W1) and about two times W (2.0×W1), inclusive. In some suitable embodiments, as shown in FIG. 4, the light-shielding structure 500 is longer than the length L of the transfer gate structure 320 by an amount L' on either side of the transfer gate structure 320, where is L' is in a range of between about one tenth of L (0.1×L) and about one half of L (0.5×L), inclusive.

Returning attention to FIG. 3, in some suitable embodiments, an isolation cap layer 600, for example, made of a suitable oxide material, may be formed over and/or on the ILD 410; and a metal layer 700 which may, for example, act at least partially as a second light-shielding structure, may be formed over and/or on the isolation cap layer 600. In some suitable embodiments, the isolation cap 600 advantageously provides improved isolation between the metal layer 700 and the first light-shielding structure 500. In some suitable embodiments, the isolation cap layer 600 has a thickness D2, for example, measured in a direction of the Z axis as shown in FIG. 3. In some embodiments, an advantageous isolation is realized when the thickness D2 is in a range of between about 100 angstroms (Å) to about 400 Å, inclusive.

As shown in FIG. 3, the light-shielding structure 500 may have a generally trapezoidal shape in cross-section. More generally, the light-shielding structure 500 may be a frustrum having upper and lower polygonal faces. As used hereinafter, “end” or “surface” or “face” may be used interchangeably or cooperatively in describing various surfaces, end, or faces of the light-shielding structure 500. The end surface 502 of the light-shielding structure 500 distal from the transfer gate structure 320 may be generally referred to herein as the upper end or face or surface, while the end surface 504 of the light-shielding structure 500 proximate to and/or facing the transfer gate structure 320 may be generally referred to herein as the lower end surface. Surfaces and/or faces 506 extending between the upper end surface 502 of the light-shielding structure 500 and the lower end surface 504 of the light-shielding structure 500 may be generally referred to herein as side walls or surfaces or faces.

In some suitable embodiments, the light-shielding structure may have a thickness D3, for example, measured in a direction of the Z axis as shown in FIG. 3 between the upper end surface 502 of the light-shielding structure 500 and the lower end surface 504 of the light-shielding structure 500. Suitably, the thickness D3 may be in a range of between about one half of D1 (0.5×D1) and about eight tenths of D1 (0.8×D1), inclusive. As shown in FIG. 3, the upper end surface 502 of the light-shielding structure 500 may be spaced apart from the proximate face or surface of the isolation cap layer 600 by a distance D3', for example, measured in a direction of the Z axis as shown in FIG. 3. In some suitable embodiments, D3' may be in a range of between about 200 Å to about 800 Å, inclusive. As shown in FIG. 3, the lower end surface 504 of the light-shielding structure 500 may be spaced apart from the proximate face or surface of the CESL 400 by a distance D3", for example, measured in a direction of the Z axis as shown in FIG. 3. In some suitable embodiments, D3" may be in a range of between about 300 Å to about 1200 Å, inclusive.

Figure 5:
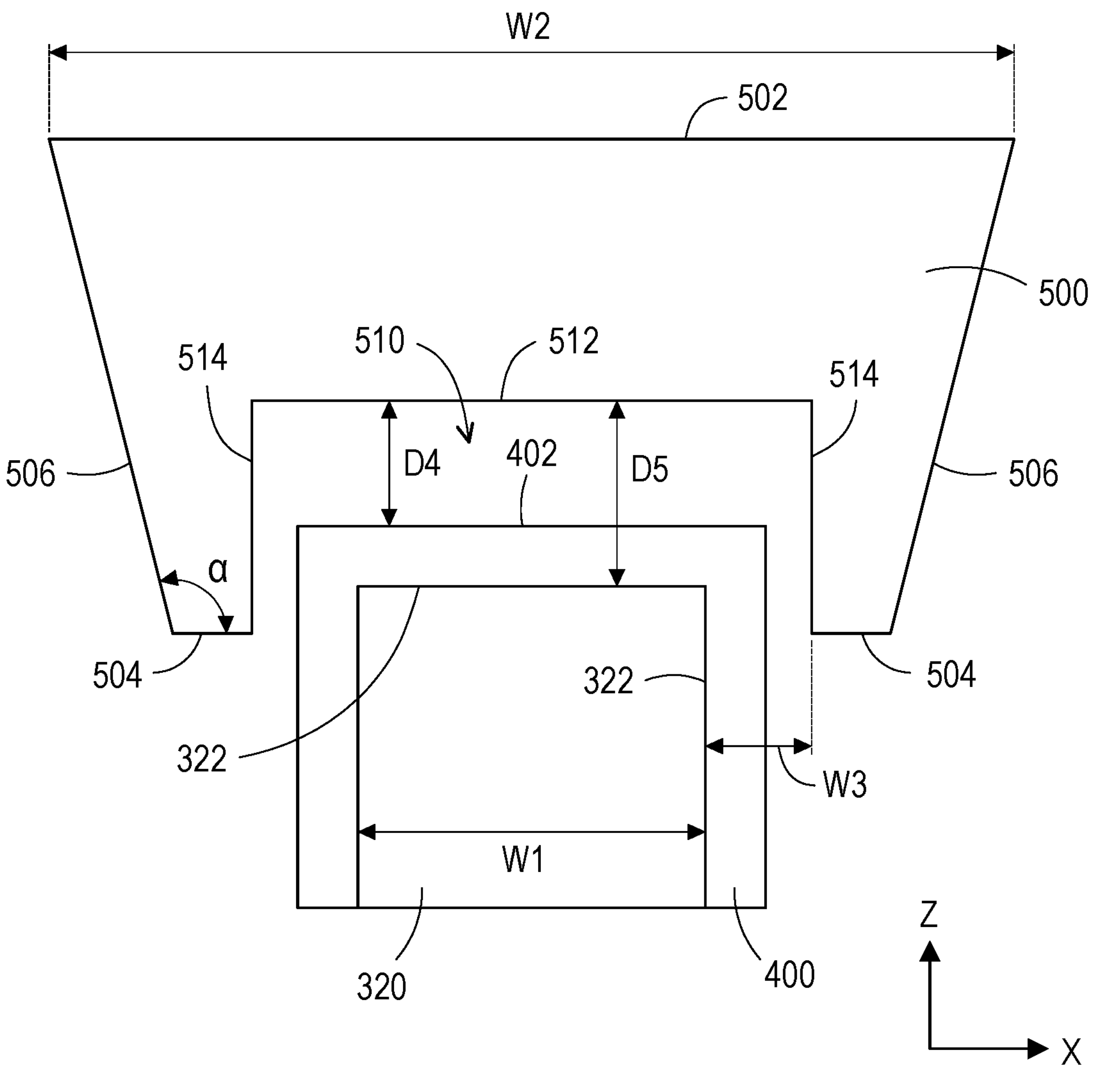
FIG. 5 is a diagrammatic illustration showing a partial cross-section view of a pixel in accordance with some embodiments disclosed herein.

FIG. 5 is a magnified partial view of a selected portion of FIG. 3, showing the light-shielding structure 500 covering the transfer gate structure 320. In some suitable embodiments, as seen in FIG. 5, the light-shielding structure 500 includes an indentation 510 on its lower end surface 504 into which the transfer gate structure 320 extends. In some suitable embodiments, the indentation 510 may be defined by an indentation base surface or upper indentation surface 512, for example, which may be substantially horizontal and/or parallel to the upper and/or lower end surfaces 502 and/or 504 of the light-shielding structure 500 and indentation side walls or surfaces 514 which extend substantially vertically (i.e., in the direction of the Z axis as shown in FIG. 5) between the indentation base surface or upper indentation surface 512 and the lower end surface 504 of the light-shielding structure 504.

In some suitable embodiments, the transfer gate structure 320 extends into the indentation 510, such that an upper end surface 322 of the transfer gate structure 320 (i.e., the end surface 322 of the transfer gate structure 320 which is distal from the substrate 302 and/or proximate to light-shielding structure 500) is within and/or surrounded or encircled by the indentation side walls or surfaces 514, either completely or substantially completely. That is to say, in the direction of the Z axis as shown in the FIGURES, the lower end surface 504 of the light-shielding structure is closer to the substrate 302 than the upper end surface 322 of the transfer gate structure 320. Advantageously, this arrangement provides better protection of the transfer gate structure 320 by the light-shielding structure 500, for example, such that stray or otherwise unwanted light is inhibited from impinging on and/or reaching the transfer gate structure 320.

As shown in FIG. 5, the transfer gate structure 320 may have a width W1, for example, measured in a direction of the X axis as shown in FIG. 5. In some suitable embodiments, the light-shielding structure 500 may have a width W2, for example, measured at the upper end surface 502 of the light-shielding structure 500 in a direction of the X axis as shown in FIG. 5. In some suitable embodiments, the width W2 may be in a range of between about one half of W1 (0.5×W1) to about four times W1 (4.0×W1), inclusive. In some embodiments, as shown in FIG. 5, the indentation side wall or surface 514 is spaced apart from an adjacent side wall or surface 322 of the transfer gate structure 320 by a distance W3, for example, measured in a direction of the X axis as shown in FIG. 5. Suitably, the distance W3 is in a range of between about one tenth of W1 (0.1×W1) and about one half of W1 (0.5×W1), inclusive.

As shown, the indentation base surface or upper indentation surface 512 is spaced apart from an adjacent face or surface 402 of the CESL 400 by a distance D4, for example, measured in a direction of the X axis as shown in FIG. 5. In some suitable embodiments, the distance D4 is in a range of between about 300 Å to about 1200 Å, inclusive. Further as sown in FIG. 5, the indentation base surface or upper indentation surface 512 is also spaced apart from the upper end surface 322 of the transfer gate structure 320 by a distance D5, for example, measured in a direction of the X axis as shown in FIG. 5. In some suitable embodiments, the distance D5 is in a range of between about one tenth of W1 (0.1×W1) and about one half of W1 (0.5×W1), inclusive. Advantageously, the foregoing arrangements and/or dimensions can provide improved shutter efficiency.

In some suitable embodiments, as shown in FIG. 5, the side walls or surfaces 506 of the light-shielding structure 500 may be angled with respect to the lower end surface 504 of the light-shielding structure 500, for example, by an angle $\alpha$. In suitable embodiments, the angle $\alpha$ may be in a range of between about 90 degrees and about 120 degrees, inclusive. Such angled side walls or surfaces 506 can benefit shutter efficiency.

Figure 6:
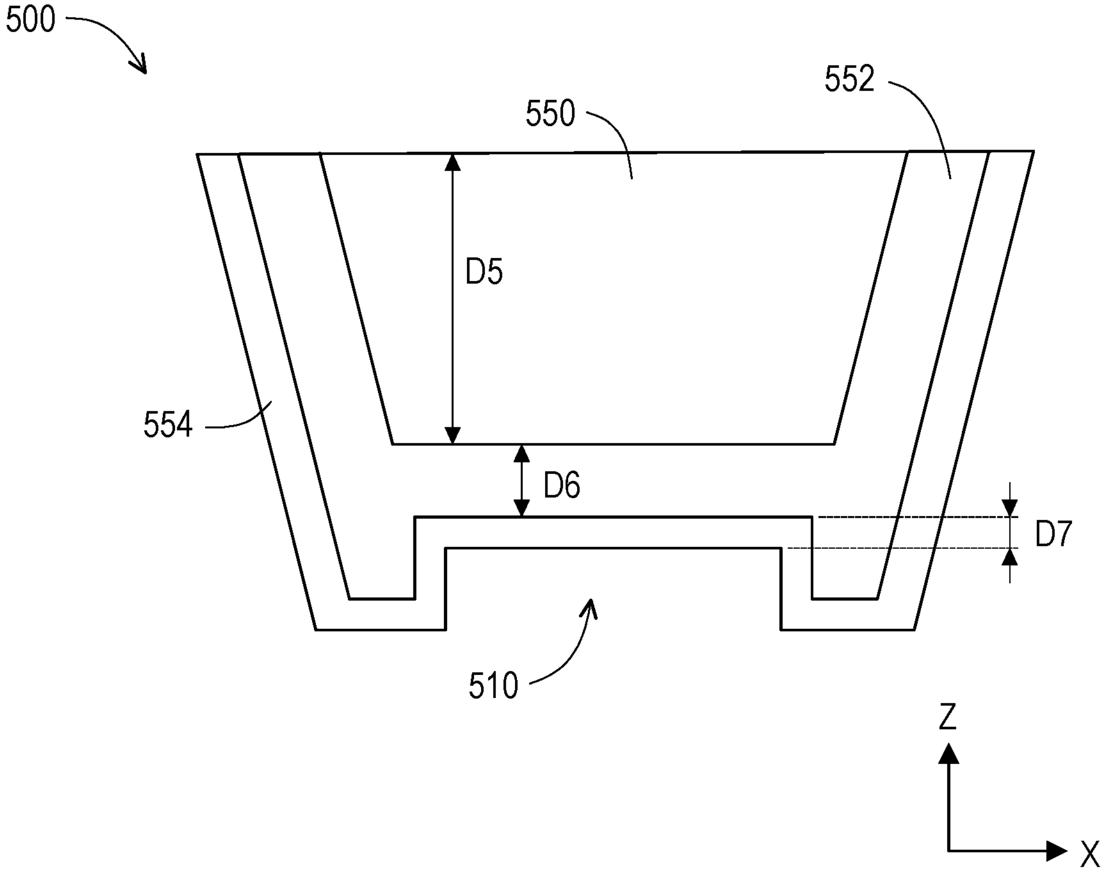
FIG. 6 is a diagrammatic illustration showing a partial cross-section view of a light-shielding structure in accordance with some embodiments disclosed herein.

With reference now to FIG. 6, the light-shielding structure 500 may be formed from and/or otherwise comprise a plurality of layers and/or material. In some suitable embodiments, a bulk material or layer 550 may be formed from a suitable metal or other like material, for example, including but not limited to aluminum, nickel, chromium, gold, germanium, copper, silver, titanium, tungsten, platinum, tantalum, chrome, alloys thereof and/or other suitable metals and/or alloys. Suitably, the layer 550 may have a thickness D5, for example, measured in a direction of the Z axis as shown in FIG. 6. For example, the thickness D5 may be in a range of between about one tenth of D1 (0.1×D1) and about seven tenths of D1 (0.7×D1), inclusive. A layer 552 may be formed and/or reside on an underside of the layer 550. In some suitable embodiments, the layer 552 may comprise SiON or the like. For example, the layer 552 may have a thickness D6 in a range of between about 5 hundredths of D1 (0.05×D1) and three tenths of D1 (0.3×D1), inclusive. In some suitable embodiments, the light-shielding structure 500 may further include a layer 554 formed and/or residing on an underside of the layer 552. Suitably, the layer 554 may comprise a suitable oxide material or the like. For example, the layer 554 may have a thickness D7 in a range of between about 5 hundredths of D1 (0.05×D1) and three tenths of D1 (0.3×D1), inclusive.

In the following, some further illustrative embodiments are described.

In some embodiments, a pixel of an image sensor includes: a semiconductor material substrate; a photosensitive region disposed in the substrate; a storage node disposed in the substrate proximate to the photosensitive region; a transfer gate structure disposed between the photosensitive region and the storage node; an inter-layer dielectric (ILD) disposed over the transfer gate structure; and a light-shielding structure contained within the ILD and covering the transfer gate structure, the light-shielding structure including an indentation on a first end surface of the light-shielding structure, which first end surface is proximate to the transfer gate structure, wherein an end of the transfer gate structure at least partially extends into the indentation such that the end of the transfer gate structure extending into the indentation is at least partially surrounded by the light-shield structure.

In some further embodiments, the pixel further includes: an oxide isolation cap layer formed over the ILD; and a metal layer formed over the oxide isolation cap layer; wherein the oxide isolation cap layer at least partially isolates the metal layer from the light-shielding structure.

In still additional embodiments, the pixel further includes a contact etch stop layer formed between the substrate and the ILD and between the transfer gate structure and the ILD.

In some embodiments, the light-shielding structure further comprises: a second end surface that is distal from the transfer gate structure; and one or more side wall surfaces that extend between the first and second end surfaces at an angle with respect to the first end surface.

In yet further embodiments, the angle is in a range of between 90 degrees and 120 degrees, inclusive.

In some further embodiments, the image sensor is a global shutter complementary metal-oxide semiconductor image sensor.

In some embodiments, the light-shielding structure is formed from a light-blocking material.

In yet further embodiments, the light blocking material is one of tungsten, chromium, titanium, a metal or a metal alloy.

In some embodiments, an image sensor includes an array of active pixels, each active pixel having: an associated photosensitive region and storage node disposed in a substrate; a transfer gate structure disposed between the photosensitive region and the storage node; an inter-layer dielectric (ILD) disposed over the transfer gate structure; and a light-shielding structure contained within the ILD and covering the transfer gate structure, the light-shielding structure including an indentation on a first end surface of the light-shielding structure, which first end surface is proximate to the transfer gate structure, wherein an end of the transfer gate structure at least partially extends into the indentation such that the end of the transfer gate structure extending into the indentation is at least partially surrounded by the light-shield structure.

In some further embodiments, each active pixel further includes: an oxide isolation cap layer formed over the ILD; and a metal layer formed over the oxide isolation cap layer; wherein the oxide isolation cap layer at least partially isolates the metal layer from the light-shielding structure.

In still further embodiments, the photosensitive region comprises a photodiode and the storage node comprises a capacitor.

In yet additional embodiments, each active pixel further includes a contact etch stop layer formed between the substrate and the ILD and between the transfer gate structure and the ILD.

In some further embodiments, the light-shielding structure further includes: a second end surface that is distal from the transfer gate structure; and one or more side wall surfaces that extend between the first and second end surfaces at an angle with respect to the first end surface, wherein the angle is in a range of between 60 degrees and 90 degrees, inclusive.

In some additional embodiments, the image sensor is a global shutter image sensor.

In some embodiments, the image sensor is a complementary metal-oxide semiconductor (CMOS) image sensor (CIS).

In some embodiments, the light-shielding structure is formed from a light-blocking material including at least one of tungsten, chromium, titanium, a metal or a metal alloy.

In some further embodiments, a method of manufacturing a global shutter (GS) complementary metal-oxide semiconductor (CMOS) image sensor (CIS) is provided. The method includes: creating a photosensitive region for a pixel of the GS CIS in a semiconductor substrate, the photosensitive region generating a photo-induced charge in response to illumination by light; creating a storage node for the pixel in the semiconductor substrate, the storage node selectively receiving the generated photo-induced charge from the photosensitive region created for the pixel; creating a transfer gate structure between the photosensitive region and the storage node to regulate a transfer of the photo-induced charge therebetween; creating an inter-layer dielectric (ILD) over the transfer gate structure; and creating a light-shielding structure contained within the ILD and covering the transfer gate structure so as to inhibit light from reaching the transfer gate structure, the light-shielding structure including an indentation on a first end surface of the light-shielding structure, which first end surface is proximate to the transfer gate structure, wherein an end of the transfer gate structure at least partially extends into the indentation such that the end of the transfer gate structure extending into the indentation is at least partially surrounded by the light-shield structure.

In still further embodiments, the method further includes: etching a cavity in the ILD; and filling the cavity with a light blocking material used to create the light-shielding structure.

In yet further embodiments, creating the photosensitive region includes creating a photodiode and creating the storage node includes creating a capacitor.

In still one more embodiment, the method further includes: creating an oxide isolation cap layer over the ILD; and creating a metal layer over the oxide isolation cap layer; wherein the oxide isolation cap layer at least partially isolates the metal layer from the light-shielding structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pixel of an image sensor comprising:
- a semiconductor material substrate;
- a photosensitive region disposed in the substrate;
- a storage node disposed in the substrate proximate to the photosensitive region;
- a transfer gate structure disposed between the photosensitive region and the storage node, the transfer gate structure having an upper end surface and a lower end surface covering at least a portion of the photosensitive region and the storage node;
- an inter-layer dielectric (ILD) disposed over the transfer gate structure; and
- a substantially trapezoidal shaped light-shielding structure contained within the ILD and completely covering the upper end surface of the transfer gate structure, the light-shielding structure including a first end surface having a first width, a second end surface having a second width less than the first width, a first side wall extending from the upper end surface to the lower end surface, and a second side wall extending from the upper end surface to the lower end surface, the light-shielding structure including an indentation on the first end surface of the light-shielding structure, which first end surface is proximate to the upper end surface of said transfer gate structure, wherein the upper end surface of said transfer gate structure at least partially extends into said indentation such that the upper end surface of said transfer gate structure is at least partially surrounded by the indentation of the light-shield structure.

2. The pixel of claim 1, further comprising:
- an oxide isolation cap layer formed over the ILD; and
- a metal layer formed over the oxide isolation cap layer;
- wherein the oxide isolation cap layer at least partially isolates the metal layer from the light-shielding structure.

3. The pixel of claim 1, further comprising:
- a contact etch stop layer formed between the substrate and the ILD and between the transfer gate structure and the ILD.

4. The pixel of claim 1, wherein the light-shielding structure further comprises:
- a second end surface that is distal from the transfer gate structure; and
- one or more side wall surfaces that extend between the first end surface and the second end surface at an angle with respect to the first end surface.

5. The pixel of claim 4, wherein the angle is in a range of between 90 degrees and 120 degrees, inclusive.

6. The pixel of claim 1, wherein the image sensor is a global shutter complementary metal-oxide semiconductor image sensor.

7. The pixel of claim 1, wherein the light-shielding structure is formed from a light-blocking material.

8. The pixel of claim 7, wherein the light blocking material is one of tungsten, chromium, titanium, a metal or a metal alloy.

9. An image sensor comprising:

an array of active pixels, each active pixel having:

an associated photosensitive region and storage node disposed in a substrate;

a transfer gate structure disposed between the photosensitive region and the storage node, the transfer gate structure having an upper end surface and a lower end surface covering at least a portion of the photosensitive region and the storage node;

an inter-layer dielectric (ILD) disposed over the transfer gate structure; and a substantially trapezoidal shaped light-shielding structure contained within the ILD and completely covering the upper end surface of the transfer gate structure, the light-shielding structure including a first end surface having a first width, a second end surface having a second width less than the first width, a first side wall extending from the upper end surface to the lower end surface, and a second side wall extending from the upper end surface to the lower end surface, the light-shielding structure including an indentation on the first end surface of the light-shielding structure, which first end surface is proximate to the upper end surface of said transfer gate structure, wherein the upper end surface of said transfer gate structure at least partially extends into said indentation such that the upper end surface of said transfer gate structure is at least partially surrounded by the indentation of the light-shield structure.

10. The image sensor of claim 9, wherein each active pixel further comprises:

an oxide isolation cap layer formed over the ILD; and a metal layer formed over the oxide isolation cap layer;

wherein the oxide isolation cap layer at least partially isolates the metal layer from the light-shielding structure.

11. The image sensor of claim 9, wherein the photosensitive region comprises a photodiode and the storage node comprises a capacitor.

12. The image sensor of claim 9, wherein each active pixel further comprises:

a contact etch stop layer formed between the substrate and the ILD and between the transfer gate structure and the ILD.

13. The image sensor of claim 9, wherein the light-shielding structure further comprises:

a second end surface that is distal from the transfer gate structure; and one or more side wall surfaces that extend between the first end surface and the second end surface at an angle with respect to the first end surface, wherein the angle is in a range of between 90 degrees and 120 degrees, inclusive.

14. The image sensor of claim 9, wherein the image sensor is a global shutter image sensor.

15. The image sensor of claim 9, wherein the image sensor is a complementary metal-oxide semiconductor (CMOS) image sensor (CIS).

16. The image sensor of claim 9, wherein the light-shielding structure is formed from a light-blocking material including at least one of tungsten, chromium, titanium, a metal or a metal alloy.

17. A global shutter (GS) complementary metal-oxide semiconductor (CMOS) image sensor (CIS), said image sensor comprising:

a photosensitive region for a pixel of the GS CIS in a semiconductor substrate, said photosensitive region generating a photo-induced charge in response to illumination by light;

a storage node for the pixel in the semiconductor substrate, said storage node selectively receiving the generated photo-induced charge from the photosensitive region created for the pixel;

a transfer gate structure between the photosensitive region and the storage node to regulate a transfer of the photo-induced charge therebetween, the transfer gate structure having an upper end surface and a lower end surface covering at least a portion of the photosensitive region and the storage node;

an inter-layer dielectric (ILD) over the transfer gate structure; and a substantially trapezoidal shaped light-shielding structure contained within the ILD and covering the transfer gate structure so as to inhibit light from reaching the transfer gate structure, the light-shielding structure including a first end surface having a first width, a second end surface having a second width less than the first width, a first side wall extending from the upper end surface to the lower end surface, and a second side wall extending from the upper end surface to the lower end surface, the light-shielding structure including an indentation on the first end surface of the light-shielding structure, which first end surface is proximate to the upper end surface of said transfer gate structure, wherein the upper end surface of said transfer gate structure at least partially extends into said indentation such that the upper end surface of said transfer gate structure is at least partially surrounded by the indentation of the light-shield structure.

18. The image sensor of claim 17, wherein the ILD has a cavity filled with a light blocking material to create the light-shielding structure.

19. The image sensor of claim 17, wherein the photosensitive region includes a photodiode and the storage node includes a capacitor.

20. The image sensor of claim 17, further comprising;

an oxide isolation cap layer over the ILD; and a metal layer over the oxide isolation cap layer, wherein the oxide isolation cap layer at least partially isolates the metal layer from the light-shielding structure.

* * * * *